(12) United States Patent
Casper

(10) Patent No.: US 6,724,329 B2
(45) Date of Patent: Apr. 20, 2004

(54) DECISION FEEDBACK EQUALIZATION EMPLOYING A LOOKUP TABLE

(75) Inventor: Bryan K. Casper, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 19 days.

(21) Appl. No.: 10/131,444

(22) Filed: Apr. 24, 2002

(65) Prior Publication Data

US 2003/0202617 A1 Oct. 30, 2003

(51) Int. Cl.[7] .................................................. H03M 7/00
(52) U.S. Cl. ........................ 341/106; 341/118; 341/120; 341/155; 341/123
(58) Field of Search ................................ 341/106, 118, 341/123, 165; 370/347, 442

(56) References Cited

U.S. PATENT DOCUMENTS

| | | | | |
|---|---|---|---|---|
| 4,129,863 A | * | 12/1978 | Gray et al. ................. | 341/172 |
| 4,200,863 A | * | 4/1980 | Hodges et al. .............. | 341/156 |
| 4,460,891 A | * | 7/1984 | Bernstein .................... | 341/156 |
| 4,754,169 A | | 6/1988 | Morris ........................ | 307/355 |
| 4,987,327 A | | 1/1991 | Fernandez et al. .......... | 307/491 |
| 5,563,598 A | | 10/1996 | Hickling ...................... | 341/155 |
| 5,710,799 A | * | 1/1998 | Kobayashi .................. | 341/118 |
| 5,841,274 A | * | 11/1998 | Masreliez et al. ..... | 324/207.17 |
| 5,870,050 A | * | 2/1999 | Hormann .................... | 341/151 |
| 5,894,280 A | * | 4/1999 | Ginetti et al. ............... | 341/118 |
| 5,920,275 A | * | 7/1999 | Hester ........................ | 341/155 |
| 6,054,851 A | * | 4/2000 | Masreliez et al. ..... | 324/207.17 |
| 6,348,882 B1 | | 2/2002 | Ciccone et al. .............. | 341/56 |
| 6,369,744 B1 | * | 4/2002 | Chuang ....................... | 341/120 |
| 6,388,521 B1 | | 5/2002 | Henry ......................... | 330/258 |
| 6,525,683 B1 | * | 2/2003 | Gu .............................. | 341/138 |

* cited by examiner

*Primary Examiner*—Michael Tokar
*Assistant Examiner*—Lam Mai
(74) *Attorney, Agent, or Firm*—Schwegman, Lundberg, Woessner & Kluth, P.A.

(57) ABSTRACT

A decision feedback equalizer includes a lookup table device. The lookup table device may include a shift register and memory, or may include multiple shift registers and memories. Near-end crosstalk may be reduced using a lookup table device. Echo in a bi-directional port circuit may also be reduced using a lookup table device.

20 Claims, 13 Drawing Sheets

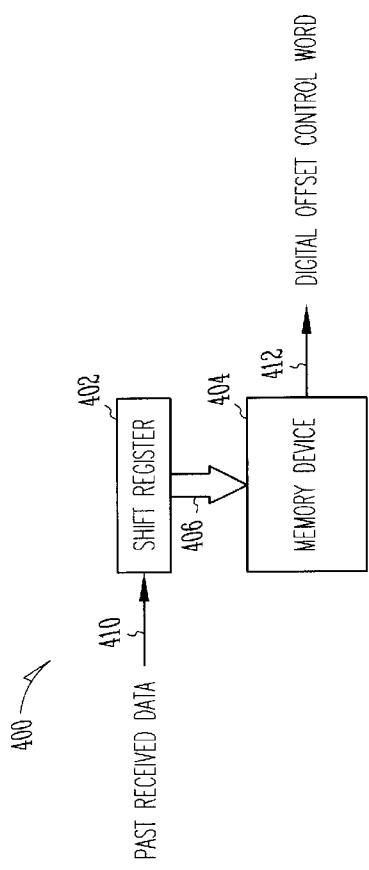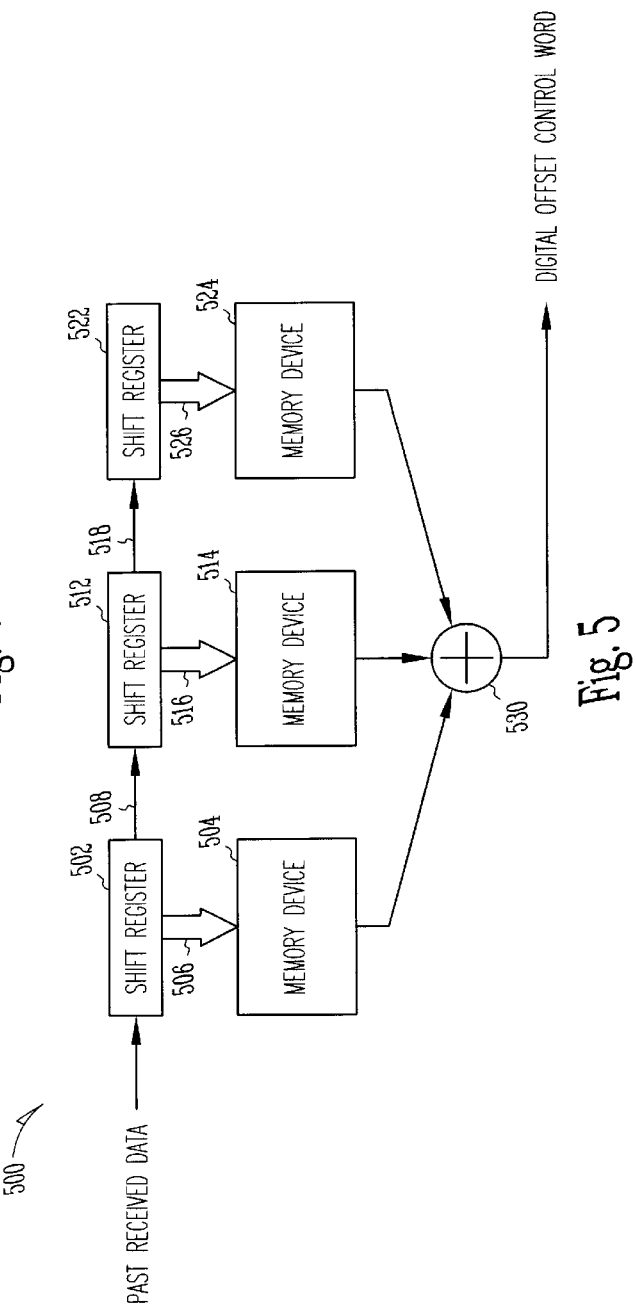

DECISION FEEDBACK EQUALIZATION EMPLOYING A LOOKUP TABLE

FIELD

This document pertains in general to circuits that equalize non-ideal communications channels, and in particular to circuits that perform an equalization process to reduce inter-symbol interference when detecting transmitted symbols.

BACKGROUND

Integrated circuits typically communicate with one another and with other devices using conductive transmission lines. The conductive transmission lines may take the form of traces on a printed wiring board, cables, or the like. Integrated circuits typically include interface circuits that include drivers and receivers coupled to the conductive transmission lines. For example, an interface circuit may have a signal driver to drive electrical signals on one transmission line, and a signal receiver to receive different electrical signals from a second transmission line. Also for example, an interface circuit may have both a signal driver and a signal receiver coupled to the same transmission line for bi-directional communication using a single transmission line.

Interface circuits transmit digital bits, or "symbols," on conductive transmission lines. A symbol may represent one or more digital bits of information. As the speed of communication increases, the symbols are transmitted faster, and the time distance between adjacent symbols becomes smaller. Signal drivers transmit symbols on conductive transmission lines, and signal receivers receive symbols on the conductive transmission lines.

An "ideal" transmission line is a transmission line that conducts an electrical signal from one end to the other without distortion. In practice, perfectly ideal transmission lines do not exist. As a result, signals that are driven onto one end of conductive transmission lines emerge with varying amounts of distortion at the other end of the transmission line. As the distortion increases, and the communication speed increases, the distortion from one symbol may cause an adjacent symbol to be received incorrectly. This phenomenon is referred to as inter-symbol interference (ISI).

To partially alleviate the effects of ISI, a feedback control technique known as decision feedback equalization may be used at the signal receiver. One implementation of this technique converts a received transmission line analog signal into a digital received signal using a very fast analog-to-digital converter. A digital feedback signal is subtracted from the digital received signal to compensate for the distortion caused by the non-ideal transmission line. The digital feedback signal is typically created by an "equalizer" that models the transmission line, and predicts the correct digital feedback signal to "equalize" the distortion, and reduce ISI.

The feedback control technique just described can consume a significant amount of circuit resources and power. For example, very fast analog-to-digital converters can consume significant space and power, as can the circuits typically used to build equalizers.

For the reasons stated above, and for other reasons stated below which will become apparent to those skilled in the art upon reading and understanding the present specification, there is a need in the art for alternate methods and apparatus for reducing inter-symbol interference.

BRIEF DESCRIPTION OF THE DRAWINGS

FIG. 4 shows a lookup table device utilizing a memory device and a shift register.

FIG. 5 shows a finite impulse response filter utilizing multiple memory devices.

DESCRIPTION OF EMBODIMENTS

Figure 1:
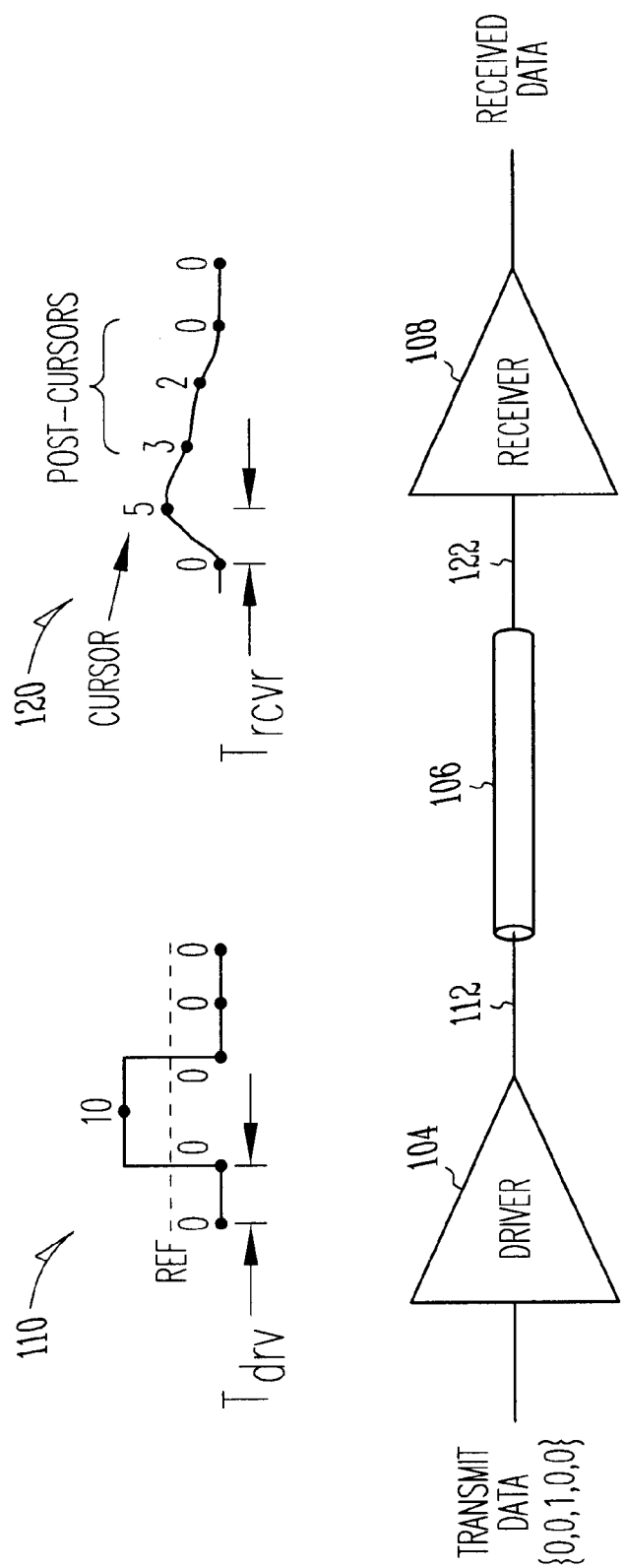
FIG. 1 shows a block diagram of a high speed transmission link used to explain the various embodiments of the equalization loop and process.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein in connection with one embodiment may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

An equalization loop and process is described that has the capability of correctly detecting the transmitted logic values at a receiver, and that may be implemented at a lower cost than the conventional, all digital equalization methodology. FIG. 1 will help explain the various embodiments of the equalization loop and process. This figure shows a block diagram of a high speed transmission link that features a far end driver 104 coupled to a near end receiver 108 via a transmission line 106. An example transmit sequence having the logic values {0,0,1,0,0} and timed according to a driver clock period $T_{drv}$ is transmitted onto signal node 112 as a rectangular transmit pulse 110.

Each of the logic values in the sequence may be mapped to a low or high signal level (e.g. 0.0 or 5.0 Volts) in the transmit pulse 110, according to the driver clock. Voltage levels discussed here are merely intended to illustrate the operation of the equalization loop and are not intended to be limiting. Those of ordinary skill in the art recognize that a range of signal levels may be used in the operation of the equalization loop. From this point forward in this description, analog signal levels are referred to as having values of from zero to ten, where zero corresponds to the lowest possible voltage, ten corresponds to the highest possible voltage, and the intermediate values represent signal levels that fall between the lowest and highest possible values.

In addition, the examples of the equalization loop and process described below are compatible with binary communication links in which each symbol in the transmitted signal can have one of only two symbolic levels (logic '1' and logic '0'). In general, however, they are compatible with multi-level links. For example, some embodiments utilize a four pulse amplitude modulation (i.e., 4 PAM) link, in which each symbol may take one of four symbolic levels (e.g., 0, 1, 2, and 3).

If transmission line 106 were ideal, then the transmit pulse would arrive undistorted at an input to receiver 108, after a time delay for traveling the length of transmission line 106. In this ideal case, the logic values can be recovered at the receiver by feeding the undistorted received pulse (corresponding to pulse 110) to the input of a comparator (not shown) having a reference level fixed at five (shown at REF in FIG. 1), which corresponds to the midpoint between the low and high signal levels. The output of the comparator could then be periodically latched, according to a receiver clock having a period $T_{rcvr}$ that may be phase and frequency locked to that of the driver clock period $T_{drv}$, to recover the transmit sequence {0,0,1,0,0}.

In practical systems, however, the actual analog signal 120 received at signal node 122 is distorted, such as in the example shown. This distortion may be due in part to attenuation effects of the practical transmission line 106. It can be seen that using the fixed reference comparator described in the previous paragraph might yield an incorrect sequence of all zeros at the receiver 108, because the sample corresponding to the transmitted logic '1' is equal to the reference level of five. The sample corresponding to the transmitted symbol is referred to herein as the "cursor," and the samples that are non-zero due to the transmitted symbol, and that follow the cursor, are referred to herein as "post-cursors."

According to an embodiment of the invention, the correct sequence of logic values may be recovered at receiver 108 by initially decreasing the reference level to 2.5 so that a received logic '0' or logic '1' will be substantially equidistant from the reference level. For example, a received logic '0' will have a signal level of zero and the first received logic '1' will have a signal level of five, so an initial reference level of 2.5 allows for proper detection of the first logic '1' occurring after a long string of logical '0s' as shown in FIG. 1. After receiving the first logical '1', the reference level may be changed each clock cycle thereafter in an attempt to maximize the margin between the reference level and the possible signal values that represent a transmitted '1' or '0.' For example, on the clock cycle subsequent to receiving the first logical '1' after a long string of zeros, a signal value of three (the first post-cursor shown in FIG. 1) will be superimposed on the transmitted data. If a logical '0' is transmitted next, a signal value of three will be present (zero plus three), and if a logical '1' is transmitted next, a signal value of eight will be present (five plus three). To maximize the margin between the reference level and the possible signal levels, the reference level should be set to 5.5 (halfway between three and eight). Varying the reference level in this manner yields the correct sequence {0,0,1,0,0} for the example shown in FIG. 1.

Figure 2:
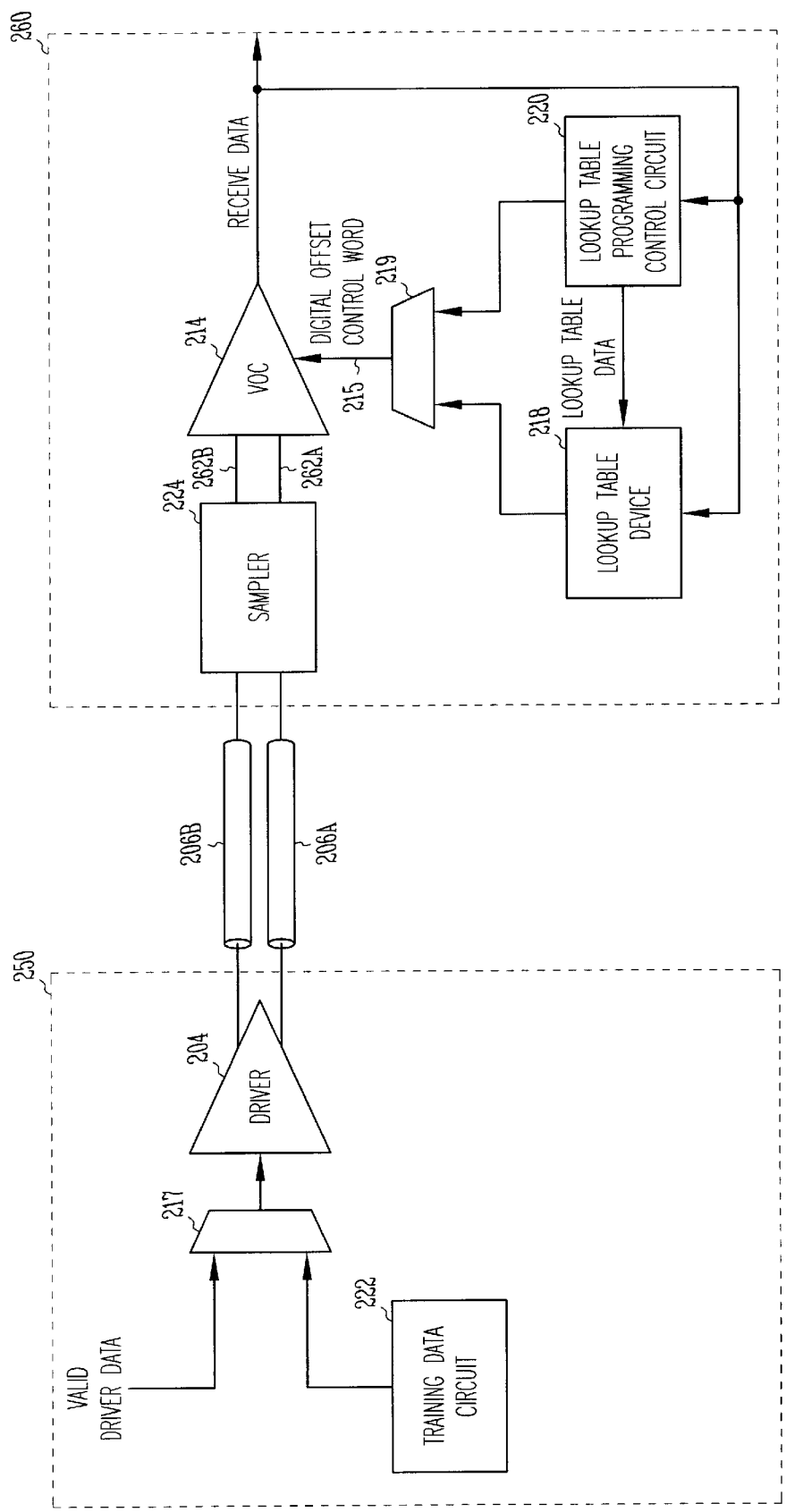
FIG. 2 depicts a block diagram of an embodiment of an equalization loop.

Turning now to FIG. 2, an equalization loop embodiment is shown that can automatically vary the reference level of a comparator to correctly recover a generalized transmit sequence. Assuming transmission line 206 can be modeled as a linear time invariant system, the loop as described below can correctly recover a wide range of transmit sequences (including a random sequence) that are linear combinations of a pulse sequence such as, for example, {0,0,1,0,0}.

FIG. 2 shows two integrated circuits at 250 and 260. Integrated circuit 250 includes driver 204, training data circuit 222, and multiplexor 217. Integrated circuit 260 includes sampler 224, variable offset comparator (VOC) 214, multiplexor 219, lookup table device 218, and lookup table programming control circuit 220. Driver 204 drives differential transmission lines 206A and 206B, and sampler 224 receives signals from differential transmission lines 206A and 206B. Differential transmission lines 206A and 206B are collectively referred to as transmission line 206.

Variable offset comparator 214 is shown in FIG. 2 with signal input nodes 262A and 262B coupled to receive a differential analog signal from transmission line 206. In other embodiments, VOC 214 has a single signal input node coupled to receive a single-ended analog signal from a transmission line. A differential system may be useful to reduce the systems susceptibility to common-mode noise, and a single-ended system may be useful in systems with larger signals that can tolerate more common-mode noise.

Variable offset comparator 214 compares the level of the received analog signal to a reference level as described above with reference to FIG. 1. According to an embodiment of the equalization loop, VOC 214 has a substantially variable offset that is controllable to represent the variable reference level. Varying the reference is performed by changing the offset of the VOC 214.

Figure 6:
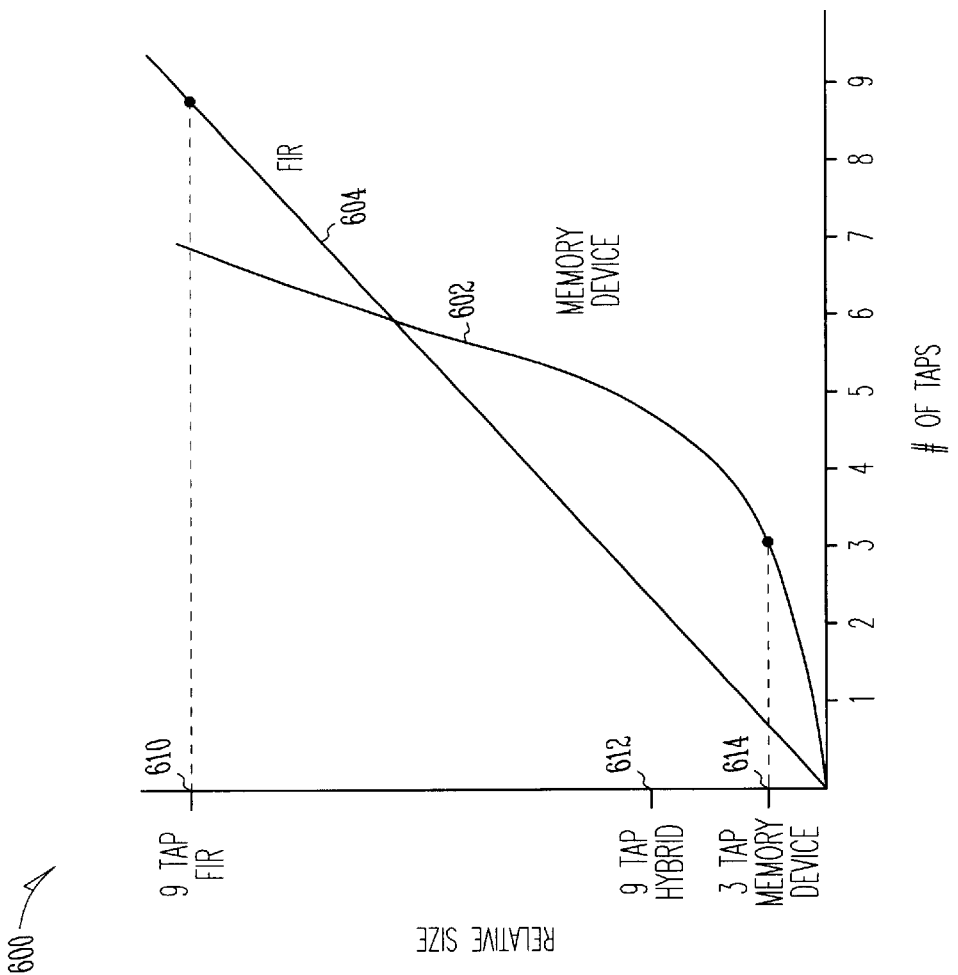
FIG. 6 depicts a graph showing the relative sizes of different types of equalizer circuits.
Figure 7:
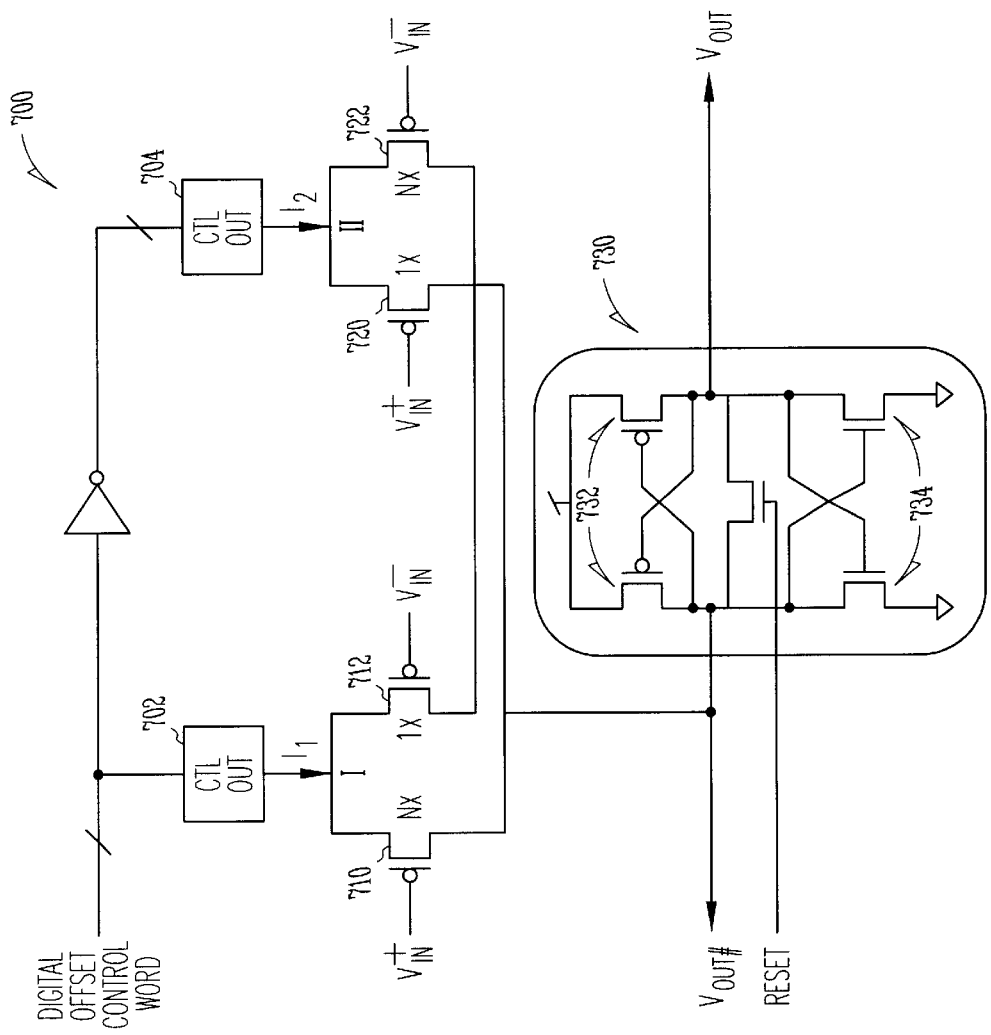
FIG. 7 depicts a circuit schematic of an embodiment of a variable offset comparator used in an embodiment of the equalization loop.

The output of the VOC 214 provides the logic value which, in the case of a binary communication link, is also considered to be the received data as the result of a comparison between the transmission line analog signal level and the variable reference level. Various embodiments of VOC 214 are shown in FIGS. 6 and 7, and are described below with reference thereto.

The equalization loop shown in FIG. 2 further includes lookup table device 218 with an input coupled to an output node of VOC 214. Lookup table device 218 also includes an output node coupled to digital offset control input node 215 of VOC 214. According to various embodiments, lookup table device 218 utilizes shift registers and memory devices arranged to logically implement a discrete time filter, such as a digital finite impulse response (FIR) filter. The discrete time filter provides a multi-bit binary value that changes in response to a sequence of logic values that form the received data. In this embodiment, the logic values are provided directly by the output of VOC 214. The digital offset control word provided to VOC 214 may be further modified by other mechanisms added to the receiver. In such cases, the lookup table device output may be added to these other codes to form a resultant offset code value.

The contents of lookup table device 218 influence the offset applied to VOC 214 as a function of past received data. In general terms, these contents correspond to the output of a discrete time filter that is implemented by lookup table device 218. The appropriate contents for lookup table device 218 may be determined by lookup table programming control circuit 220 during a calibration period. During the calibration period, driver 204 is fed periodic training pulses (generated by training data circuit 222), rather than valid driver data, through multiplexer 217. The transmitted logic value sequence in the training pulses is known by the lookup table programming control circuit 220.

During the calibration period, the lookup table programming control circuit 220 may need to directly control the offset of VOC 214. Multiplexer 219 allows lookup table programming control circuit 220 to directly control the offset of VOC 214 during the calibration period. With the contents of lookup table device 218 set so that the received data output from VOC 218 matches the known logic values transmitted from training data circuit 222, the loop is ready for normal operation to detect valid driver data. Since the amount of distortion in transmission line 206 may change over time while the data communication system is in operation, the calibration period may be repeated to adapt the contents of the lookup table device to yield improved detection at the receiver.

In the embodiment of FIG. 2, a sampler unit 224 is coupled between the signal input node of VOC 214 and transmission line 206. Sampler unit 224 may be implemented using a sample and hold circuit with an output node to provide a sampling of the transmission line analog signal level at a particular point in time. Sampler unit 224 may be used to reduce jitter in the received data. In such an embodiment, sampler unit 224 is clocked by a receiver clock signal (not shown) that may be phase and frequency locked to a driver clock signal (not shown). In another embodiment, sampler unit 224 is not used, and the transmission line analog signal is fed directly to the signal input node of VOC 214. In such a case, VOC 214 or its latched output may be timed by the receiver clock.

Figure 3:
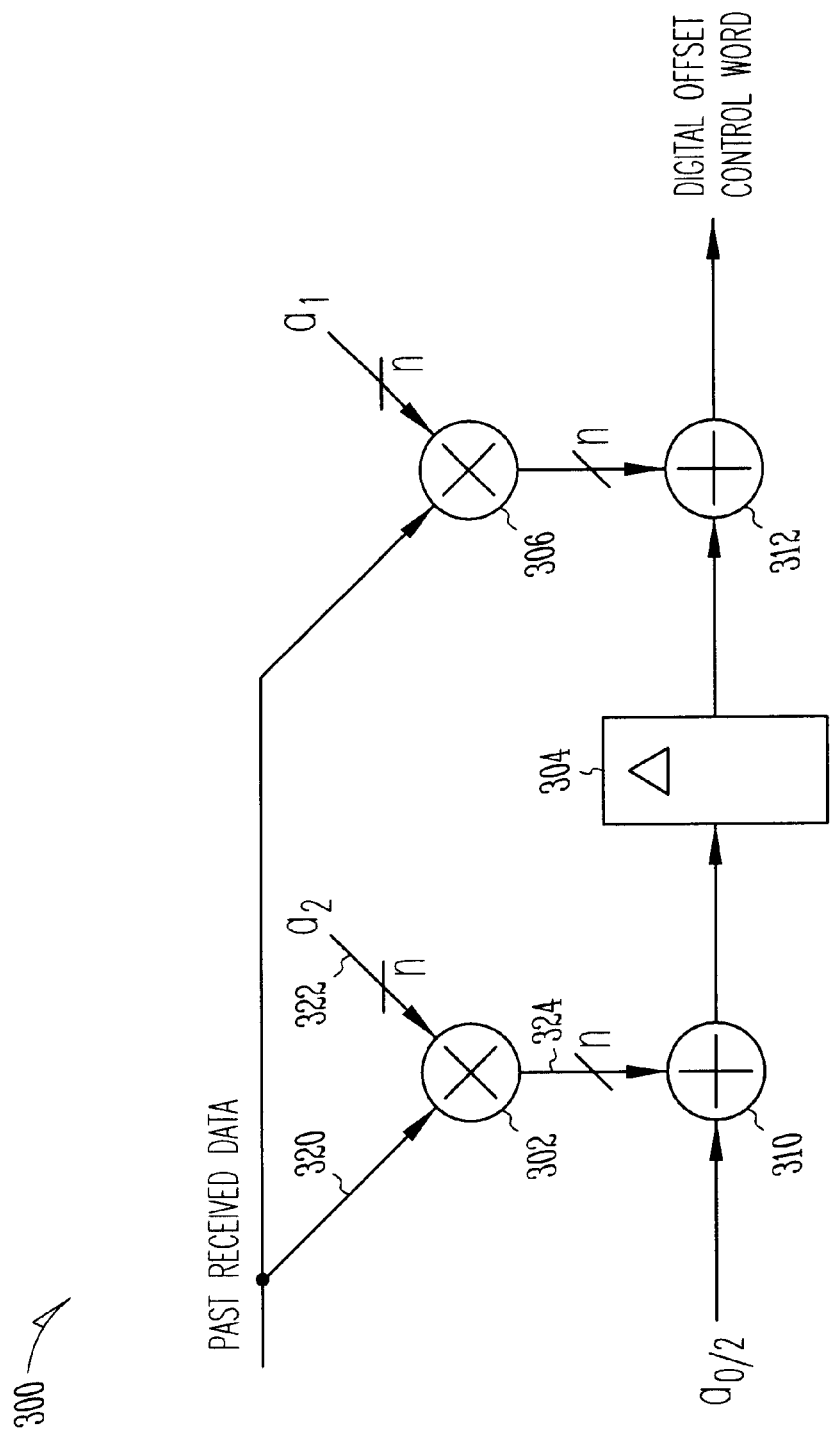
FIG. 3 illustrates a symbolic representation of an exemplary digital filter for use in the equalization loop.

Referring now to FIG. 3, a symbolic representation of an exemplary digital FIR filter is shown. This FIR can be logically implemented by lookup table device 218 (FIG. 2), albeit with various performance and size differences as discussed below. This particular filter design includes delay element 304 that can store the results of a linear operation on past received data. Use of this particular filter design can allow the loop to correctly detect the transmitted sequence {0,0,1,0,0} from the distorted received signal shown in FIG. 1. The values of the filter coefficients are selected to be $a_0=5$, $a_1=3$, and $a_2=2$. These were selected in view of the distortion shown in FIG. 1 and the fact that, in this embodiment, the filter output directly represents the offset of VOC 214. Table 1, below, shows the operation of the equalization loop in such a case:

TABLE 1

| Time Point | Receiver Input | VOC Offset | VOC Comparison | VOC Output | Filter Output |
|---|---|---|---|---|---|
| 1 | 0 | 2.5 | 0 − 2.5 = −2.5 | 0 | 2.5 |
| 2 | 5 | 2.5 | 5 − 2.5 = 2.5 | 1 | 5.5 |
| 3 | 3 | 5.5 | 3 − 5.5 = −2.5 | 0 | 4.5 |
| 4 | 2 | 4.5 | 2 − 4.5 = −2.5 | 0 | 2.5 |
| 5 | 0 | 2.5 | 0 − 2.5 = −2.5 | 0 | 2.5 |
| 6 | 0 | 2.5 | 0 − 2.5 = −2.5 | 0 | 2.5 |

Each row in Table 1 above describes an update to the loop made just after its corresponding time point. The six time points are those shown at signal 120 in FIG. 1. It can be seen from Table 1 that the selected filter coefficients cause the VOC output to yield the correct sequence. The difference between the level at the receiver input and the effective reference level of the VOC is in all cases equal to 2.5. This difference is known as the 'voltage margin' at the input to the VOC. This voltage margin as determined from the table is symmetrical, i.e., the voltage margin is the same for a logic '1' as well as for a logic '0' at the VOC input. The voltage margin is a measure of how much noise in the analog transmitted signal can be tolerated by the receiver, before the receiver output yields the wrong symbol value.

The FIR shown in FIG. 3 further includes multipliers 302 and 306, and adders 310 and 312. Multiplier 302 receives past received data on node 320 and also receives the coefficient $a_2$ on node 322. Multiplier 302 multiplies the past received data and the coefficient to produce a product on node 324. Node 324 is a signal node that includes multiple physical signal lines, shown as "n" in FIG. 3. Because node 324 represents a digital word with a finite number of signal lines, a small amount of error is introduced due to quantization. The quantization error can be reduced by increasing the value of "n;" however, a corresponding increase in area is then consumed by multiplier 302 and adder 310. Multiplier 306 also introduces quantization error. Adders 310 and 312 do not contribute quantization error provided that they are large enough to not experience any overflow.

Finite impulse response filter 300 is referred to as a "two tap" filter because two past data samples are used: one is input to multiplier 302, and one is input to multiplier 306. The past received data on node 320 consists of digital '1s' and '0s.' When the past received data is a '0', a multiplier will produce a value of zero on its output. When the past received data is a '1', the multiplier will produce a value equal to the corresponding coefficient on its output. For example, when the past received data on node 320 is a '0,' signal node 324 will have a digital word equal to zero. Also for example, when the past received data on node 320 is a '1,' signal node 324 will have a digital value of equal to coefficient $a_2$.

Each tap in the finite impulse response filter has a coefficient equal to a sample value in the impulse response. In situations where the impulse response lasts a long time, it may be advantageous to include many taps in the filter to perform effective equalization. Increasing the number of taps, however, can cause quantization from each tap to accumulate, and result in a large "cumulative quantization error." Cumulative quantization error occurs because of limited resolution in the digital words that represent the tap weights in the filter. To take advantage of a large number of taps while maintaining small cumulative quantization error, the resolution must be fine enough to measure the small post-cursors far away from the cursor. The combination of high resolution and increased number of taps dramatically increases the complexity of the system.

FIG. 4 shows a lookup table device utilizing a memory device and a shift register. Lookup table device 400 is a lookup table device suitable for use as lookup table device 218 (FIG. 2). Lookup table device 400 includes shift register 402 and memory device 404. Shift register 402 receives data serially on node 410 and outputs data in parallel on nodes 406. Memory device 404 receives the parallel data output from shift register 402 on nodes 406, and produces a digital offset control word on nodes 412.

Lookup table device 400 logically implements an FIR filter similar to that shown in FIG. 3. Finite impulse response filter 300 (FIG. 3) receives past received data and outputs a digital offset control word. Lookup table device 400 also receives past received data and outputs a digital offset control word. In contrast to finite impulse response filter 300, however, lookup table device 400 does not exhibit cumulative quantization error as a result of quantization error for each tap in the filter. Rather than having multiple sources of quantization error that sum to create a cumulative quantization error, lookup table device 400 includes the output of memory device 404 as a single source of quantization error.

Shift register 402 can include any number of delay elements, and nodes 406 can include any number of physical signal lines. For example, in some embodiments, shift register 402 includes five delay elements, and nodes 406 include five signal lines. This corresponds to memory device 404 having five bits of address information. Also in some embodiments, the digital offset control word on node 412 is five bits wide. This corresponds to memory device 404 storing five bits of information at each address. In embodiments that have nodes 406 equal to five bits wide, lookup table device 400 corresponds to a five tap FIR filter. For every additional tap, one additional address bit is added to node 406, and memory device 404 doubles in size. This is described in more detail below with reference to FIG. 6.

FIG. 5 shows a lookup table device utilizing multiple memory devices. Lookup table device 500 includes shift registers 502, 512, and 522, memory devices 504, 514, and 524, and adder 530. Shift registers 502, 512, and 522 are cascaded such that the output of one is input to the next. For example, shift register 512 receives serial data from shift register 502 on node 508 and outputs serial data to shift register 522 on node 518. Each shift register also outputs parallel data to a corresponding memory device. For example, shift register 502 outputs parallel data on node 506 to memory device 504, shift register 512 outputs parallel data on node 516 to memory device 514, and shift register 522 outputs parallel data on node 526 to memory device 524. Each memory device shown in FIG. 5 receives parallel data and outputs a digital word to adder 530. Adder 530 receives the data output from the various memory devices, and sums it to create a digital offset control word.

In embodiments represented by FIG. 5, each shift register and memory device combination can implement a plurality of taps of an FIR filter. For example, when each of nodes 506, 516, and 526 are three bits wide, each shift register and memory device combination implements three taps of a nine tap FIR filter. Although the filter includes nine taps, only three sources of quantization error exists. These three sources are the outputs of memory devices 504, 514, and 524.

Lookup table device 500 is a "hybrid" device that utilizes some elements from the memory device embodiment of FIG. 4, and some elements from the FIR filter embodiment of FIG. 3. Specifically, each memory device implements a group of one or more taps, and an adder sums the output of the memory devices.

FIG. 6 depicts a graph showing the relative sizes of different types of equalizer circuits. Graph 600 shows curves 602 and 604. Curve 602 represents the relative size of a lookup table device utilizing a single memory device, such as lookup table device 400 (FIG. 4). Curve 604 shows the relative size of an FIR filter implemented using multipliers and adders, such as FIR filter 300 (FIG. 3). As shown by curve 602, the size of the memory device doubles for each additional tap. As explained above, this is due to an additional address bit being added to the memory device. As shown by curve 604, the size of a finite impulse response filter using multipliers and adders increases substantially linearly as taps are added. This is because for each additional tap, one additional multiplier and one additional adder is used. In practice, curve 604 may not be quite linear, in part because as each additional tap is added, the size of the additional adder may increase.

The relative size of a nine tap FIR filter is shown at 610. The corresponding size of a nine tap filter implemented with a memory device would be much larger. The relative size of a three tap filter implemented with a memory device is shown at 614, and the relative size of a nine tap hybrid device such as device 500 (FIG. 5) is shown at 612. As shown in FIG. 6, the nine tap hybrid device has a smaller size than the nine tap finite impulse response filter, and as discussed above, has fewer sources of quantization error.

The embodiments discussed with reference to FIG. 6 include three tap and nine tap filters. In some embodiments, the relationships between the curves shown are different depending on how the memory devices are implemented, and how many bits are maintained in the circuits. For example, graph 600 shows that the relative sizes of an FIR and a memory device would be equal at around six taps. In some embodiments, many more taps can be used before the size of the memory device equals the size of the FIR, and in other embodiments, the sizes are equal at a point representing fewer than six taps. Many design trade-offs can be made depending on the importance of size, power, and desired precision.

FIG. 7 depicts a circuit schematic of an embodiment of a variable offset comparator (VOC) used in an embodiment of the equalization loop. VOC 700 is a VOC suitable for use as VOC 214 (FIG. 2). VOC 700 includes an amplifier circuit including first and second differential pairs which are defined by transistors 710, 712, and 720, 722, respectively. Variable current generators 702 and 704 are also coupled to control the tail currents $I_1$ and $I_2$ to the respective differential pairs. Current generators 702 and 704 are controlled by the digital offset control word (see FIG. 2) that is received on multiple signal nodes as shown. In this embodiment, each digital value of the offset control word corresponds to two oppositely varying tail currents $I_1$ and $I_2$ that are substantially equidistant from a nominal tail current. In some embodiments, variable current generators 702 and 704 are implemented using a plurality of current sources connected in parallel, with each of the current sources controlled by one of the bits in the offset control word. Transistors can be sized within variable current generators 702 and 704 so that a binary offset control word controls the variable current in a binary fashion, or so that the current varies linearly with the number of bits set to a logical '1' in the offset control word.

A single ended output voltage for this comparator may be available as either $V_{out}$ or $V_{out}\#$. To drive these output signals into one of two possible stable states, a regenerative load circuit 730 is provided as shown. After being reset by an input signal, this regenerative load circuit 730 quickly amplifies any difference between $V_{out}$ and $V_{out}\#$, where such amplification occurs at a relatively high gain due to the cross coupled n-channel pair 734 and p-channel pair 732, thereby ensuring that the output signals $V_{out}$ and $V_{out}\#$ only assume one of two possible stable states. Thus, if $V_{in}^+$ is greater than $V_{in}^-$ by at least the amount of offset that has been selected (as referred back to the input of the differential pairs), then the regenerative latch circuit 730 forcefully drives $V_{out}$ to a low voltage level and simultaneously drives $V_{out}\#$ to a high voltage level. Other types of regenerative latch circuits may be used to provide the digital output signal.

Figure 8:
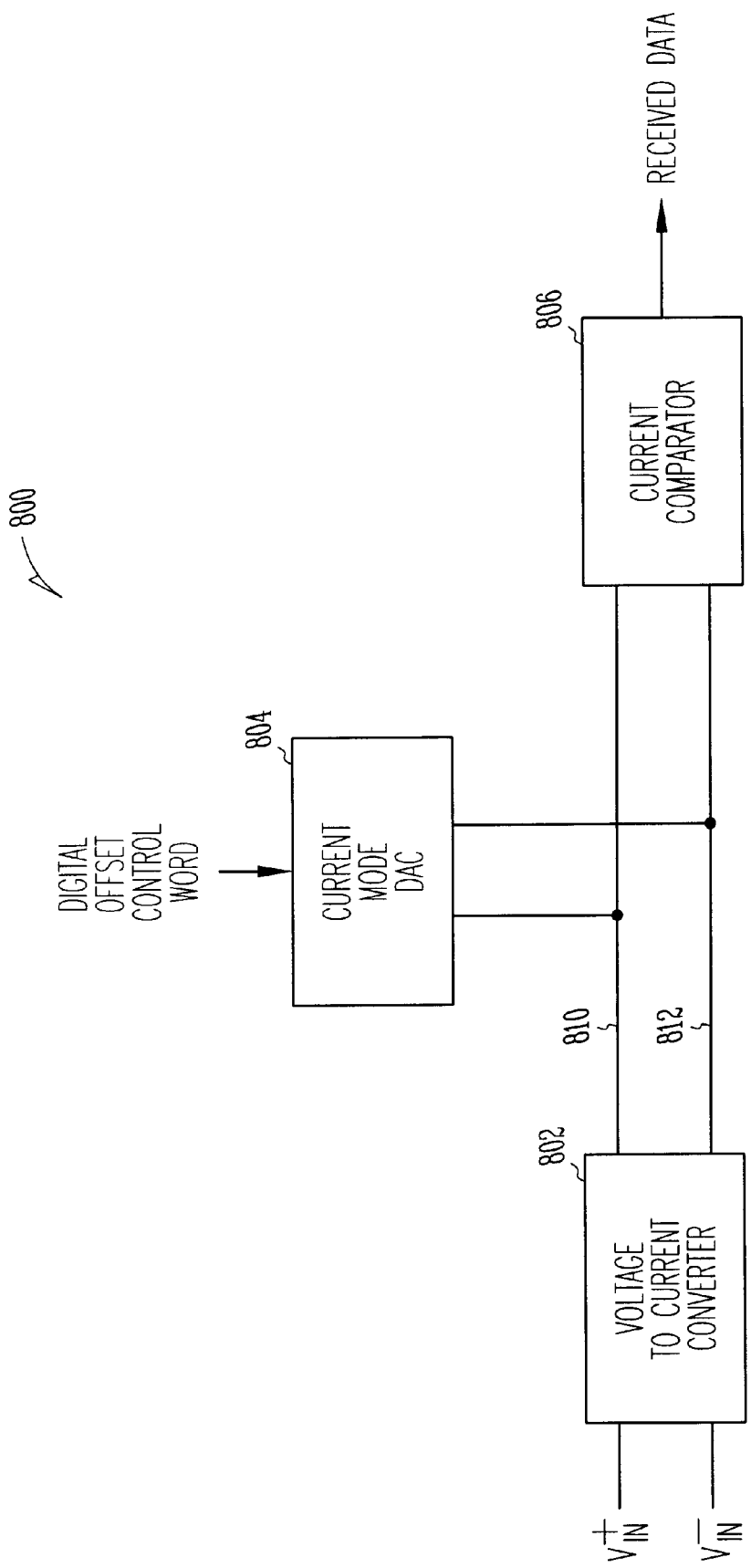
FIG. 8 shows a block diagram of another embodiment of a variable offset comparator.

FIG. 8 shows a block diagram of another embodiment of a variable offset comparator (VOC). VOC 800 includes voltage-to-current converter 802, current mode digital-to-analog (DAC) converter 804, and current comparator 806. Voltage-to-current converter 802 receives analog input voltages $V_{in}^+$ and $V_{in}^-$ and produces a differential current on current summing nodes 810 and 812. Current mode DAC 804 receives the digital offset control word and produces a differential current that varies as a function thereof. The currents output from voltage-to-current converter 802 and current mode DAC 804 sum on nodes 810 and 812, and are input to comparator 806. Comparator 806 compares the currents on the current summing nodes and produces a digital output.

Figure 9:
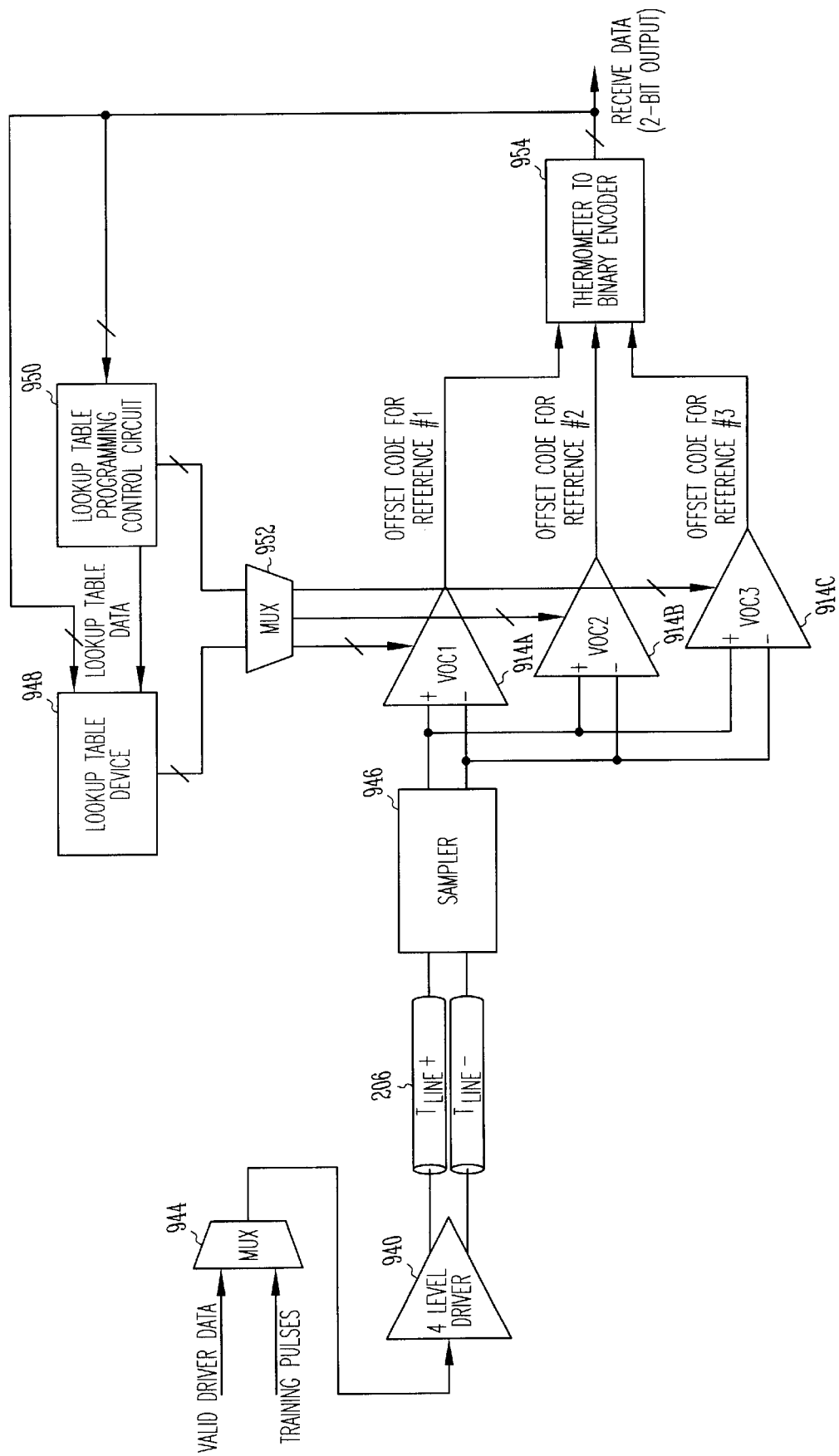
FIG. 9 illustrates a block diagram of a high speed transmission link featuring a multi-level receiver in which an equalization loop is implemented.

FIG. 9 illustrates a block diagram of a high speed transmission link featuring a multi-level receiver in which an equalization loop is implemented. The multi-level receiver shown in this embodiment includes 3 VOCs 914A, 914B, and 914C that are designed to detect the symbols of a 4 pulse amplitude modulation (i.e. 4 PAM) link. As in the embodiment of FIG. 2, a sampler 946 may be provided to help reduce jitter in the received data.

This 4 PAM multi-level receiver may be reference calibrated by modifying the offsets of the various VOCs while training pulses of known amplitude are received. Once the three reference levels have been calibrated, the multi-level receiver may be permitted to detect 4 PAM amplitude modulated data symbols. These symbols are transmitted by a four level driver 940 that is fed by the output of multiplexer (MUX) 944 with valid driver data.

A lookup table device 948 having contents determined by lookup table programming control circuit is also provided to automatically control the offset code for each VOC, based on received data provided by a three bit to two bit thermometer encoder 954. A multiplexer 952 is provided to allow the offset for each VOC 914 to be controlled by either the lookup table device 948 during normal operation, or by the lookup table programming control circuit 950 during a calibration procedure in which the contents of lookup table device 948 are determined.

Assuming transmission line 206 can be modeled as a linear time invariant system, the loop as shown in FIG. 9 can correctly recover a wide range of transmit sequences (including a random sequence) that are linear combinations of a set of pulse sequences such as, for example, {0,0,1,0,0} {0,0,2,0,0} and {0,0,3,0,0}.

During a calibration period, driver 940 is fed periodic training pulses, rather than valid driver data, through MUX 944. During the calibration period, lookup table programming control unit 950 may directly control the offset of each VOC 914. In some embodiments, a bank of lookup table devices (as part of lookup table device 948) are coupled to control the variable offset of each VOC 914 so that a generalized sequence of multi-bit symbols may be accurately detected in the presence of distortion caused by travel through transmission line 206.

Figure 10:
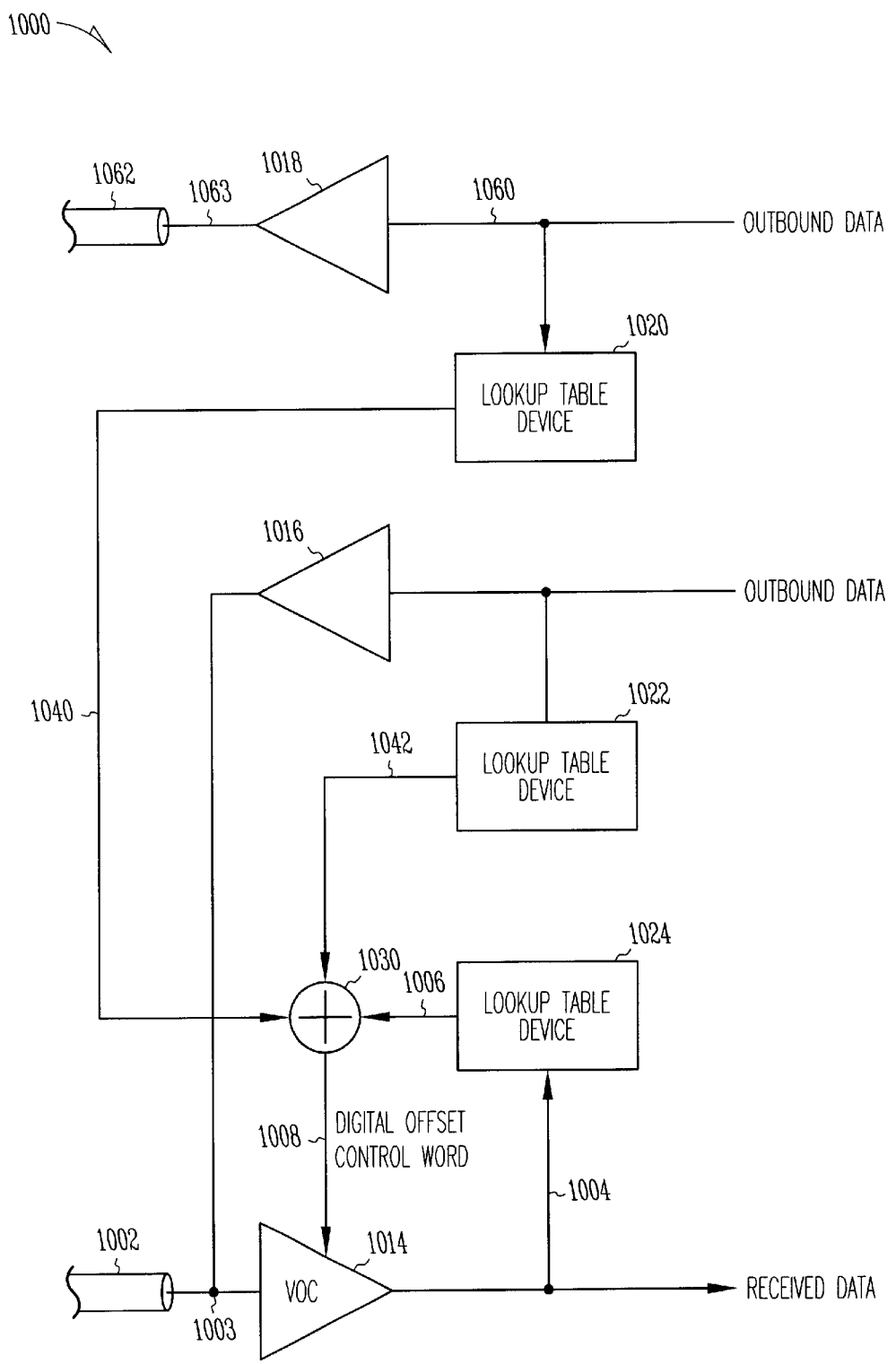
FIG. 10 shows an embodiment of an integrated circuit with decision feedback equalization combined with echo and near-end crosstalk cancellation.

FIG. 10 shows an embodiment of an integrated circuit with decision feedback equalization combined with echo and near-end crosstalk cancellation. Integrated circuit 1000 includes variable offset comparator (VOC) 1014, drivers 1016 and 1018, lookup table devices 1020, 1022, and 1024, and adder 1030. Driver 1016 and VOC 1014 combine to create a simultaneous bi-directional data port coupled to transmission line 1002. As previously described, lookup table device 1024 receives past received data on node 1004 and produces an offset control word on node 1006. This control word contributes to digital offset control word on node 1008 to equalize the effects of distortion caused by transmission line 1002. In addition to offset control information on node 1006, adder 1030 receives offset control information from lookup table devices 1020 and 1022. Offset control information received from lookup table 1020 is received on near-end crosstalk node 1040, and offset control information received from lookup table device 1022 is received on echo cancellation node 1042.

Driver 1018 is referred to herein as a near-end driver. Near-end driver 1018 may be a driver located in close physical proximity to VOC 1014, such that crosstalk occurs. For example, as outbound data on node 1060 causes near-end driver 1018 to drive data on transmission line 1062, crosstalk may occur that further distorts any signals received by VOC 1014. Lookup table device 1020 includes offset control information that models the effects of this crosstalk so that distortion caused by the crosstalk can be subtracted using the digital offset control word. Similar to driver 1018 causing crosstalk, driver 1016 may cause echoes that appear as distortion to VOC 1014. Lookup table device 1022 includes offset control information to subtract the effects of echo caused by driver 1016.

Nodes 1003 and 1063 are "interface nodes" that are electrically accessible from both inside and outside the integrated circuit. For example, driver 1016 and VOC 1014 access interface node 1003 from inside the integrated circuit, and transmission line 1002 accesses interface node 1003 from outside the integrated circuit.

For clarity, lookup table programming control circuits have been omitted from FIG. 10. In some embodiments, separate lookup table programming control circuits exist for each of lookup table devices 1020, 1022, and 1024, and in some embodiments a single lookup table programming control circuit is utilized for all three lookup table devices.

Figure 11:
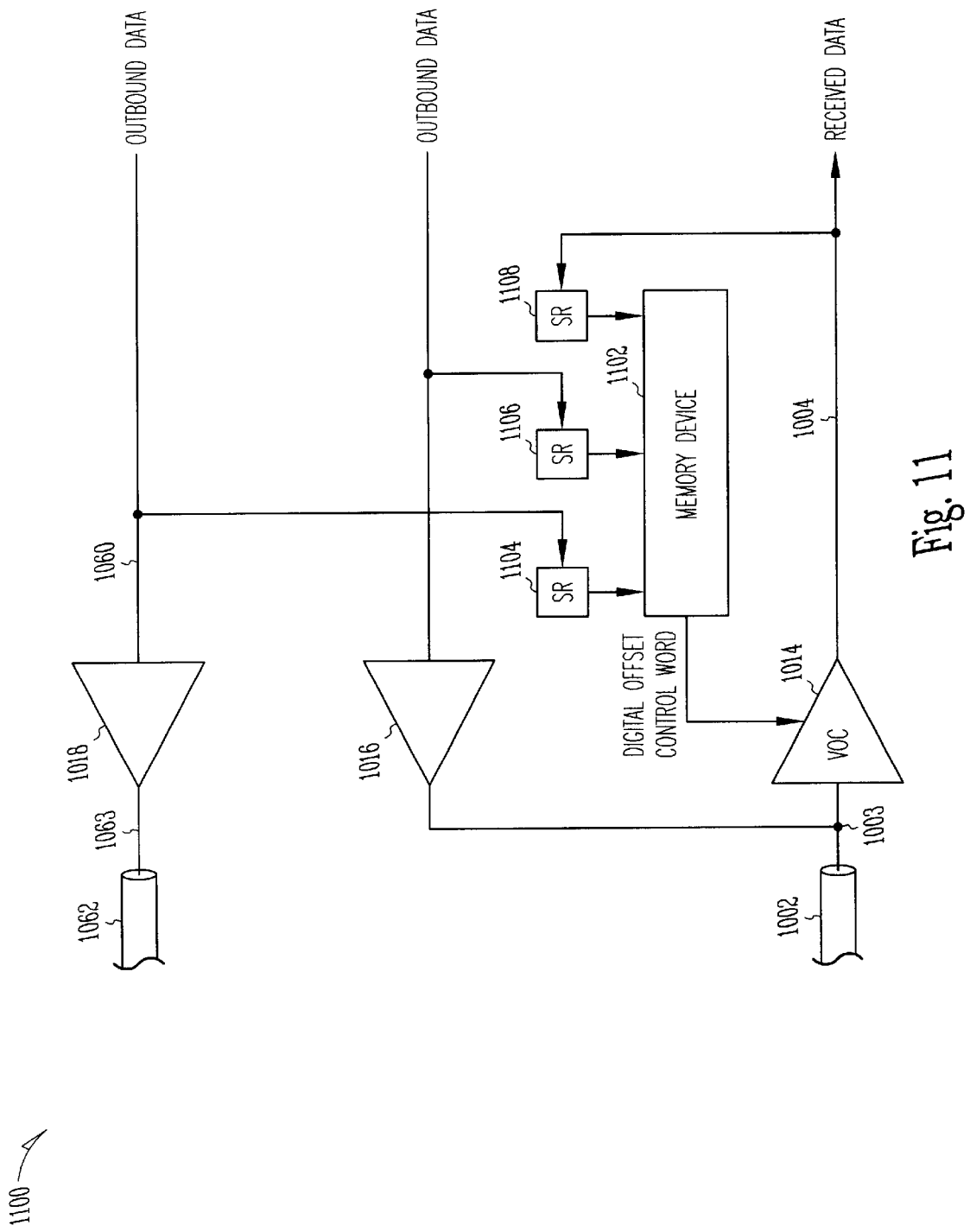
FIG. 11 shows another embodiment of an integrated circuit with decision feedback equalization combined with echo and near-end crosstalk cancellation.

FIG. 11 shows another embodiment of an integrated circuit with decision feedback equalization combined with echo and near-end crosstalk cancellation. Integrated circuit 1100 includes VOC 1014 that receives a digital offset control word to reduce the effects of distortion caused by a non-ideal transmission line, near-end crosstalk, and echo. Integrated circuit 1100 differs from integrated circuit 1000 in the manner in which the digital offset control word is generated. Rather than having three separate memory devices and an adder, integrated circuit 1100 includes shift registers (SR) 1104, 1106, and 1108, and memory device 1102. Each of shift registers 1104, 1106, and 1108 can have any number of delay elements, and memory device 1102 can be of arbitrary size.

Figure 12:
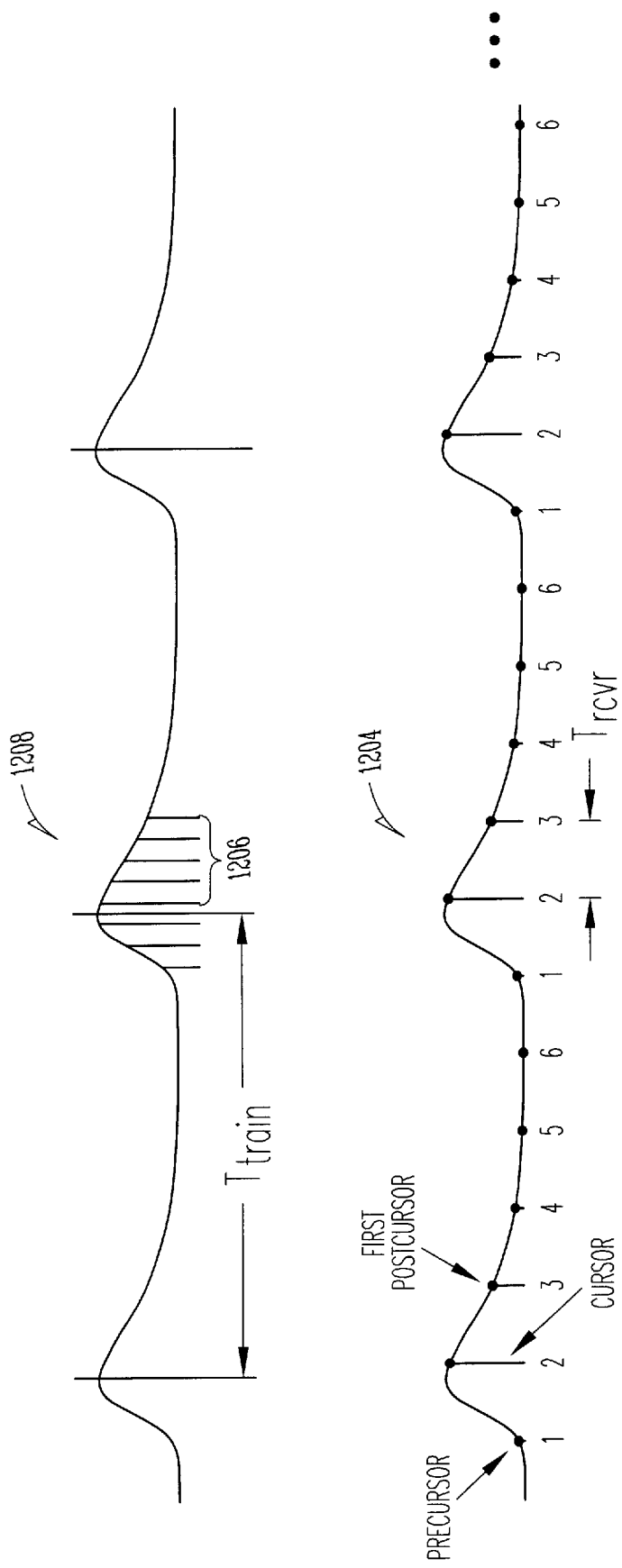
FIG. 12 shows a pair of periodic pulse signals generated during a calibration procedure for the equalization loop.

In the above described embodiments, it has been assumed that the receiver can generate correctly positioned periodic time points, one of which being referred to as the "cursor"

as shown in FIG. 12. In addition, to determine the lookup table contents, knowledge of the signal level values at the cursor as well as at the post- and pre-cursors may be needed (see FIG. 12). Accordingly, FIG. 13 illustrates a flow diagram of an embodiment of a process for digitizing a received pulse that is being periodically repeated, for determining the cursor, post-cursor, and pre-cursor (if any) levels.

Figure 13:
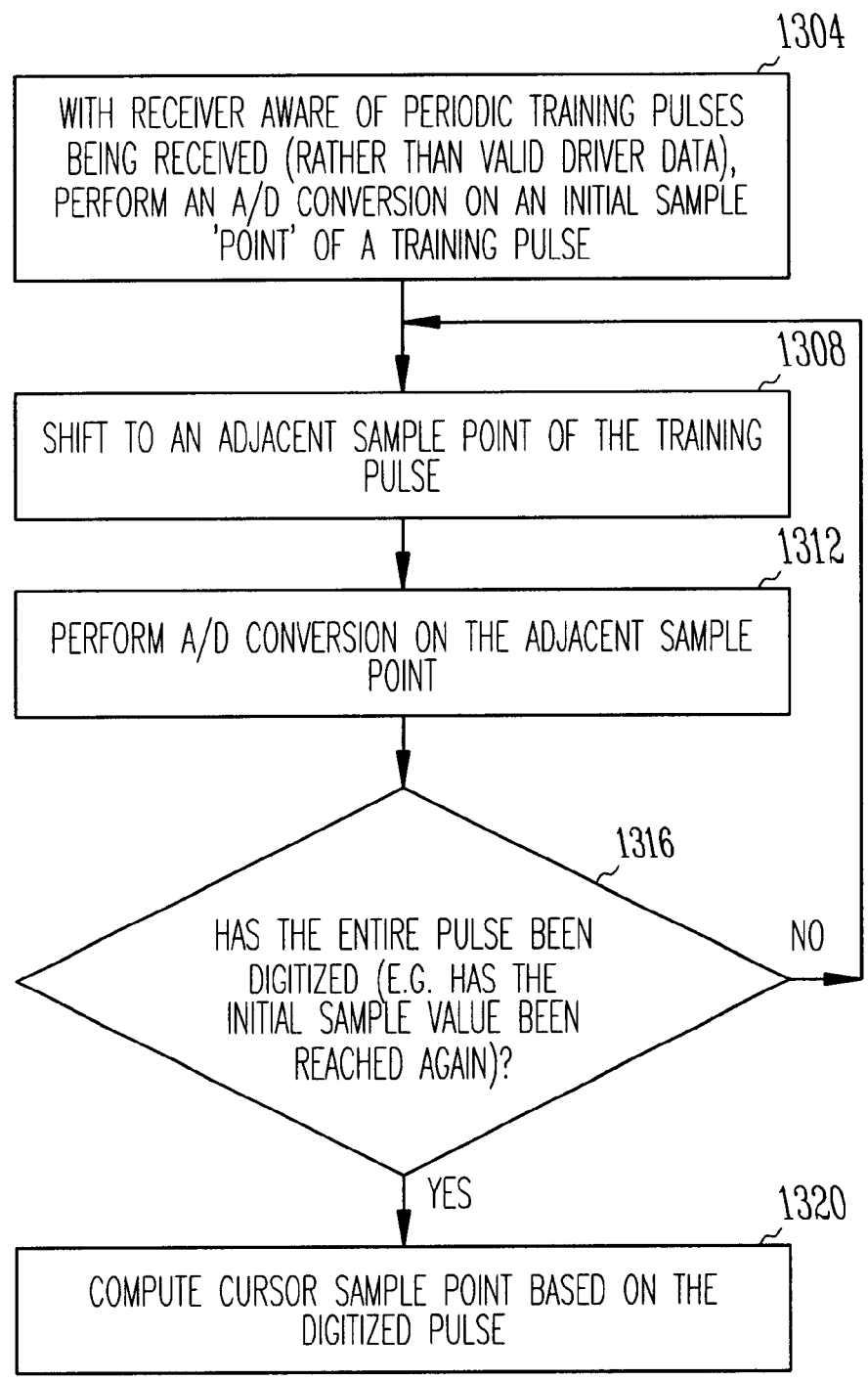
FIG. 13 illustrates a flow diagram of an embodiment of a process for determining the cursor level used in the equalization loop.

Referring to FIG. 13 and to the periodic training pulses as part of a pulse signal 1204 shown in FIG. 12, the system can be designed so that the receiver is aware that periodic pulses, rather than valid driver data, are being received. The periodic pulses are sufficiently spaced apart in time to allow the transmission line to settle (e.g., to allow reflections of a pulse to die out) before each subsequent pulse is transmitted. An analog to digital (A/D) conversion is performed on an initial sample point, having a non-zero signal level, of a training pulse (operation 1304). This may be done by the receiver itself, using the VOC as connected in FIG. 2, according to a successive approximation A/D converter process. Alternatively, other A/D conversion procedures may be used, including those that are performed by a dedicated, off-chip integrated circuit test system rather than an on-chip A/D conversion technique in the receiver. The process continues with operation 1308.

In operation 1308, a shift is performed to an adjacent sample point of the training pulse. A number of possible sampling points are illustrated at 1206 in FIG. 12. The spacing should be small enough so that the pulse is sufficiently digitized to yield useful signal levels. After shifting to the adjacent sample point, the A/D conversion is repeated for that new sample point (operation 1312). Operations 1308 and 1312 are repeated until the entire training pulse has been digitized (operation 1316). One way to decide when the entire pulse has been digitized is when the digitized signal level of the pulse has returned to its initial value computed in operation 1304.

Once the pulse has been digitized in its entirety, the cursor may be determined as follows (operation 1320). For example, the time point having the maximum (absolute value) digitized level in the received training pulse may be selected to be the cursor. Alternatively, the cursor may be selected as the time point at which the following relationship is satisfied for the digitized pulse:
maximum of $$\text{cursor level} - \{\Sigma|\text{precursor levels}| + \Sigma|\text{postcursor levels}|\}$$

A cursor selected according to this relationship is also known as an eye-opening of the particular receiver. Note that the cursor computed using the above relationship is not necessarily the same as the time point at which the signal level of the pulse is at its maximum. Other techniques for determining the cursor may be possible. For example, in some embodiments, statistical processing is performed on the digitized pulse data over a number of pulses to obtain a better estimate of the cursor location.

Once the cursor has been selected for the training pulse, the post-cursors and pre-cursors (if any) can also be readily identified based on a receiver clock period $T_{rcvr}$ (see FIG. 12, pulse 1204). According to an embodiment, these values can also be used to compute the contents of a lookup table device. The values of the cursor and post-cursors correspond to the coefficients of the digital FIR filter shown in FIG. 3, where $a_0$=the cursor level, $a_1$=the first post-cursor level, and $a_2$=the second post-cursor level.

Note that the pulse 120 shown in FIG. 1 is referred to as one that only has post-cursor ISI, because the pre-cursor signal levels are zero. The above-described embodiments may also be used to correctly detect received pulses that have pre-cursor ISI as well, namely those in which the pre-cursor signal levels are non-zero. If pre-cursor ISI is expected in the received signal, e.g., if the signal level at the first time point in the pulse 120 were non-zero, then the $a_0$ coefficient of the digital FIR filter may be modified so that the correct logic value (in this example, 0) is still detected.

According to an embodiment, once the cursor has been determined during the calibration period, the phase of the receiver clock is re-adjusted according to the cursor and then is locked to that of the driver clock. In addition, once the calibration period is over, the driver clock should not drastically change its phase or frequency prior to starting the transmission of valid data, if doing so might throw the receiver clock out of lock. Other techniques for clocking the receiver and the driver are possible.

Figure 14:
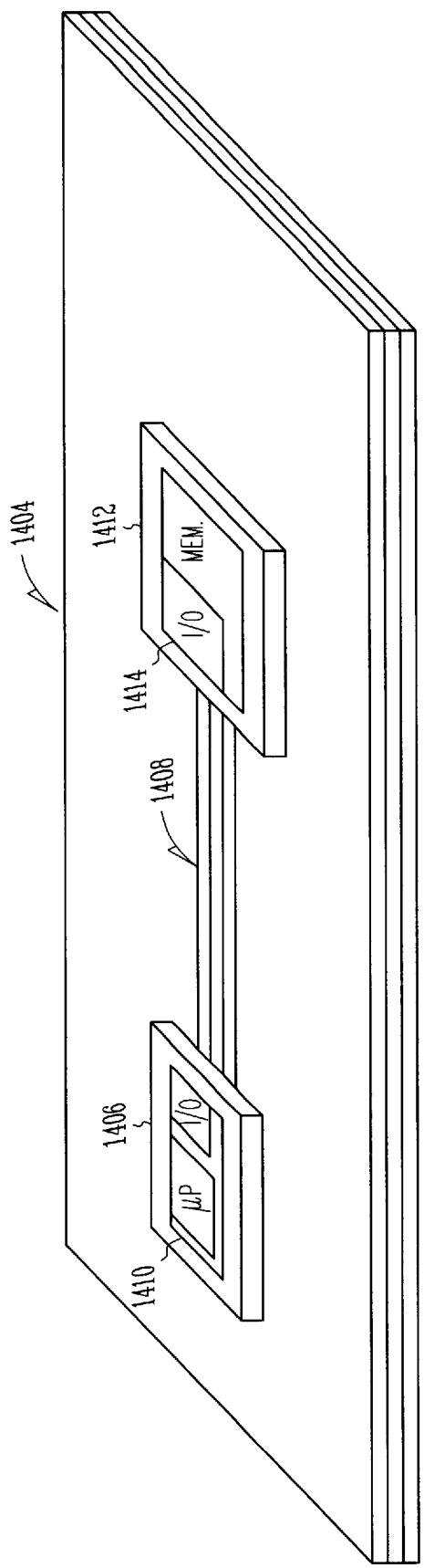
FIG. 14 shows an embodiment of an electronic system in which a communication link features the equalization loop.

FIG. 14 shows an embodiment of an electronic system in which a communication link features the equalization loop described above. The system has a multi-layer printed wiring board 1404 on which a parallel bus 1408 is formed. The bus 1408 may be of the point-to-point variety, or a multi-drop bus such as those used in a main memory. An integrated circuit (IC) chip package 1406 is operatively installed on the board to communicate using the parallel bus 1408. The installation of the package 1406 may be done by a surface mount technique or via a connector or socket. The package has an IC chip 1410 that includes a logic function section, and an input/output (I/O) section as an interface between the logic function section and the bus 1408. The logic function section may be one of the following well-known devices: a microprocessor, a memory controller, and a bus bridge. Alternatively, other devices that can be implemented in the logic function section of an IC chip may be used. The I/O section has a bus receiver in which an equalization loop as described above is provided.

A second IC package 1412 is also installed on the board 1404 to communicate with the first package 1406 via the bus 1408. The second IC package 1412 also includes a chip 1414 having an I/O section in which a bus receiver is provided to interface the bus 1408, and its own logic function section (here shown as a memory controller).

According to an embodiment, the I/O interfaces of the two chips 1410 and 1414 communicate with each other bi-directionally, that is using the same conductive lines of the bus for both transmitting and receiving data. Thus, in such an embodiment, drivers are provided, in both IC chips, that are connected to the same conductive lines of the bus 1408. Other system applications of the equalization loop are possible, including, for example, a cable receiver.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A circuit comprising:
   a variable offset comparator having a signal input node, a digital control input, and a digital output node; and
   a lookup table device coupled between the digital output node and the digital control input of the variable offset comparator.

2. The circuit of claim 1 wherein the variable offset comparator comprises:
   first and second differential transistor pairs; and first and second variable current generators coupled to the first and second differential transistor pairs, respectively, wherein the first and second variable current generators are coupled to be responsive to the digital control input.

3. The circuit of claim 1 wherein the variable offset comparator comprises:

a voltage-to-current converter coupled between the signal input node and a current summing node; and a digital-to-analog converter having a current output, the digital-to-analog converter coupled between the digital control input and the current summing node.

4. The circuit of claim 1 wherein the lookup table device includes a shift register and a memory.

5. The circuit of claim 4 further comprising a lookup table programming control circuit to fill the memory with digital data.

6. The circuit of claim 1 wherein the lookup table device includes a finite impulse response filter including a group of taps implemented with a memory device.

7. The circuit of claim 6 wherein the finite impulse response filter further includes a plurality of groups of taps, each of the plurality of groups of taps having a shift register and a memory device.

8. The circuit of claim 1 further comprising:

a driver coupled to drive an output signal on the signal input node; and an echo cancellation node coupled between the driver and the lookup table device to provide an indication of data driven by the driver to the lookup table device.

9. The circuit of claim 8 wherein the lookup table device includes:

a first shift register coupled to receive data from the digital output node;

a second shift register coupled to receive the indication of data driven by the driver; and a memory device coupled to receive address bits from the first and second shift registers, and coupled to provide a digital control word to the digital control input.

10. The circuit of claim 1 further comprising:

a driver coupled to drive an output node other than the signal input node; and a near-end crosstalk cancellation node coupled between the driver and the lookup table device to provide an indication of data driven by the driver to the lookup table device.

11. The circuit of claim 10 wherein the lookup table device includes:

a first shift register coupled to receive data from the digital output node;

a second shift register coupled to receive the indication of data driven by the driver; and a memory device coupled to receive address bits from the first and second shift registers, and coupled to provide a digital control word to the digital control input.

12. A circuit, comprising:

a lookup table device including a memory device, the lookup table device to couple to a digital output node and a digital input of a variable offset comparator.

13. The circuit of claim 12 further comprising:

an echo cancellation node coupled between a driver and the lookup table device to provide an indication of data driven by the driver to the lookup table device.

14. The circuit of claim 13 further comprising:

a shift register coupled to receive the indication of data drive by the driver.

15. The circuit of claim 12 further comprising:

a shift register coupled to receive data from the digital output node.

16. The circuit of claim 12, wherein the memory device is coupled to receive address bits from a plurality of shift registers included in the circuit, and to provide a digital control word to the digital control input.

17. A circuit, comprising:

a variable offset comparator having a digital control input and a digital output node to couple to a lookup table device.

18. The circuit of claim 17 wherein the variable offset comparator comprises:

a voltage-to-current converter coupled between a signal input node and a current summing node of the variable offset comparator.

19. The circuit of claim 18 further comprising:

a digital-to-analog converter to couple to the digital control input and the current summing node, and having a current output.

20. The circuit of claim 17 further comprising:

a driver coupled to drive an output signal on a signal input node of the variable offset comparator; and an echo cancellation node coupled to the driver and the lookup table device to provide an indication of data driven by the driver to the lookup table device.

* * * * *

UNITED STATES PATENT AND TRADEMARK OFFICE
CERTIFICATE OF CORRECTION

PATENT NO. : 6,724,329 B2
DATED : April 20, 2004
INVENTOR(S) : Casper

It is certified that error appears in the above-identified patent and that said Letters Patent is hereby corrected as shown below:

<u>Column 14,</u>
Line 13, after "digital" insert -- control --, therefor.
Line 20, delete "drive" and insert -- driven --, therefor.

Signed and Sealed this

Twenty-seventh Day of July, 2004

JON W. DUDAS
*Acting Director of the United States Patent and Trademark Office*